United States Patent
Moschiano et al.

(10) Patent No.: US 8,400,827 B2
(45) Date of Patent: Mar. 19, 2013

(54) NON-VOLATILE MEMORY PROGRAMMING

(75) Inventors: Violante Moschiano, Bacoli (IT); Giovanni Santin, Rieti (IT)

(73) Assignee: Micron Technology, Inc., Boise, ID (US)

( * ) Notice: Subject to any disclaimer, the term of this patent is extended or adjusted under 35 U.S.C. 154(b) by 344 days.

(21) Appl. No.: 12/795,202

(22) Filed: Jun. 7, 2010

(65) Prior Publication Data
US 2011/0299333 A1    Dec. 8, 2011

(51) Int. Cl.
*G11C 16/00*    (2006.01)
(52) U.S. Cl. ......... 365/185.03; 365/185.18; 365/185.19; 365/185.28
(58) Field of Classification Search .................. None
See application file for complete search history.

(56) References Cited

U.S. PATENT DOCUMENTS

| | | | | |
|---|---|---|---|---|
| 5,570,315 | A * | 10/1996 | Tanaka et al. | 365/185.22 |
| 6,888,745 | B2 * | 5/2005 | Ehiro et al. | 365/158 |
| 7,808,836 | B2 * | 10/2010 | Murin et al. | 365/185.28 |

* cited by examiner

*Primary Examiner* — Tan T. Nguyen
(74) *Attorney, Agent, or Firm* — Schwegman, Lundberg & Woessner, P.A.

(57) ABSTRACT

Some embodiments include a memory device and a method of programming memory cells of the memory device. One such method includes applying different voltages to data lines associated with different memory cells based on threshold voltages of the memory cells in an erased state. Other embodiments including additional memory devices and methods are described.

23 Claims, 6 Drawing Sheets

| MEMORY CELL (FIG. 2) | TARGET $VT_i$ | $V_{BLi}$ (FIG. 2) | EXAMPLE $V_{BLi}$ VALUES (VOLT) |
|---|---|---|---|
| 210 | $VT_0$ | $V_{BL0} = V_X$ | 2.4 |
| 211 | $VT_1$ | $V_{BL1} = V_3$ | 1.6 |
| 213 | $VT_2$ | $V_{BL3} = V_2$ | 0.8 |
| 212 | $VT_3$ | $V_{BL2} = V_0$ | 0 |

NON-VOLATILE MEMORY PROGRAMMING

BACKGROUND

Non-volatile memory devices such as flash memory devices are used in many computers and electronic devices to store data (e.g., information). A flash memory device usually has a programming operation to store data, a read operation to retrieve the stored data, and an erase operation to clear data from the memory. These programming, read, and erase operations often involve applying various voltages to different parts of the memory device.

A conventional non-volatile memory device may go through many programming, read, and erase operations during its life. Thus, improper control of the voltages applied to the device during these operations may lead to inferior device performance, reliability, or both.

DETAILED DESCRIPTION

Figure 1:
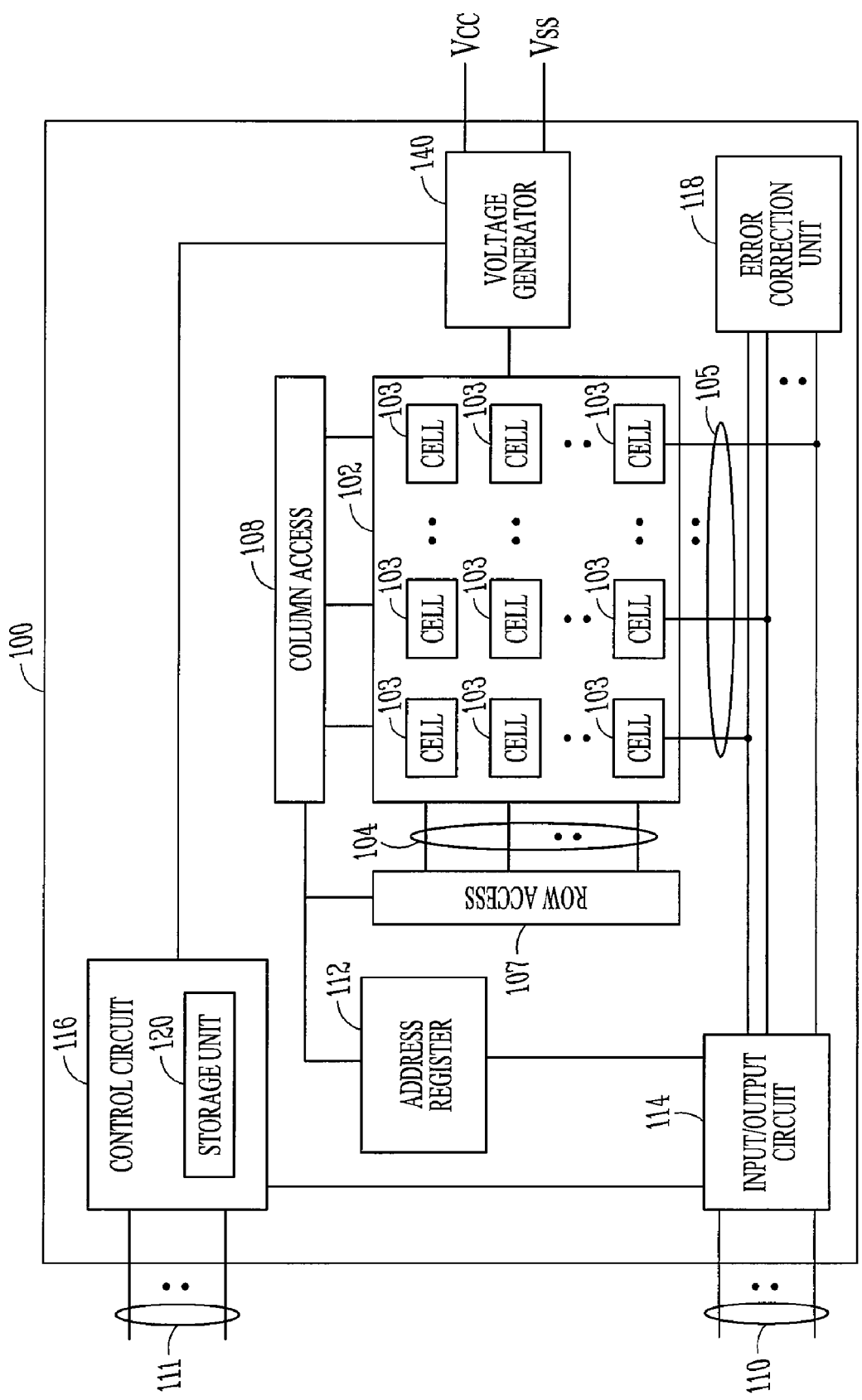
FIG. 1 shows a block diagram of a memory device, according to an embodiment of the invention.

FIG. 1 shows a block diagram of a memory device 100, according to an embodiment of the invention. Memory device 100 includes a memory array 102 with memory cells 103 that may be arranged in rows and columns along with access lines 104 and data lines 105. Memory device 100 can use access lines 104 to access memory cells 103 and data lines 105 to transfer data with memory cells 103. Row access 107 and column access circuitry 108 respond to an address register 112 to access memory cells 103 based on row address and column address signals on terminals 110, 111, or both. A data input/output circuit 114 transfers data between memory cells 103 and terminals 110. Terminals 110 and 111 may be external terminals of memory device 100 (e.g., terminals exposed outside a chip or semiconductor package that contains memory device 100).

A control circuit 116 controls operations of memory device 100 based on signals present on terminals 110 and 111. A device (e.g., a processor or a memory controller) external to memory device 100 may send different commands (e.g., programming commands and read commands) to memory device 100 using different combinations of signals on terminals 110, 111, or both.

Memory device 100 responds to commands to perform operations such as programming, read, and erase operations. A programming operation may write data from terminals 110 to memory cells 103 (e.g., transfer data from terminals 110 to memory cells 103). The programming operation can generally be called a write operation. A read operation reads data from memory cells 103 to terminals 110 (e.g., transfer data from memory cells 103 to terminals 110). An erase operation erases data (e.g., clears data) from all memory cells 103 or from a portion of memory cells 103.

Memory device 100 receives supply voltages Vcc and Vss. Vcc may include a positive voltage value, and Vss may include a ground potential. Memory device 100 can also include a voltage generator 140. Voltage generator 140 and control circuit 116 operate to provide different voltages to memory array 102, such as to cause memory array 102 to receive different voltages during the operations (e.g., programming operations) of memory device 100.

Memory device 100 may include an error correction unit 118 to check for errors in data read from memory cells 103. Error correction unit 118 may include error correction circuitry to correct errors based on an error correction code (ECC), as is well-known to those of ordinary skill in the art.

Memory device 100 may include a storage unit 120, which may include memory elements such as registers. Storage unit 120 may include a hardware portion, a firmware portion, or both, of memory device 100. Storage unit 120 may also be used to store codes (e.g., software programming instructions).

Memory device 100 can be a flash memory device such as a NAND flash or a NOR flash memory device, or other kinds of memory devices.

Memory device 100 can be a single-level-cell memory device such that memory cells 103 store a single bit of data. For example, memory cells 103 may store either a binary "0" value or a binary "1" value of a single bit of data.

Memory device 100 can be a multi-level-cell (MLC) memory device such that each of memory cells 103 can store multiple bits or portions of bits of data (e.g., a value corresponding to two, three, four, or some other number of bits of data). For example, when each of memory cells 103 corresponds to a 2-bit per cell, each of memory cells 103 may store one of four possible combinations of two binary bits of data (i.e., combination 00, 01, 10, and 11 corresponding to two bits of data). In another example, when each of memory cells 103 corresponds to a 3-bit per cell, each of memory cells 103 may store one of eight possible combinations of three binary bits of data (i.e., one of 000, 001, 010, 011, 100, 101, 110, and 111). In another example, when each of memory cells 103 corresponds to a four-bit per cell, each of memory cells 103 may store one of 16 possible combinations of four binary bits of data (i.e., one of 0000, 0001, 0010, 0011, 1000, and so on, up to 1111).

Single level and MLC memory devices may be combined within the device 100. One of ordinary skill in the art will readily recognize that memory device 100 can include other parts, which are omitted from FIG. 1 to help focus on the various embodiments described herein. Memory device 100 may include one or more of the embodiments described below with reference to FIG. 2 through FIG. 9.

Figure 2:
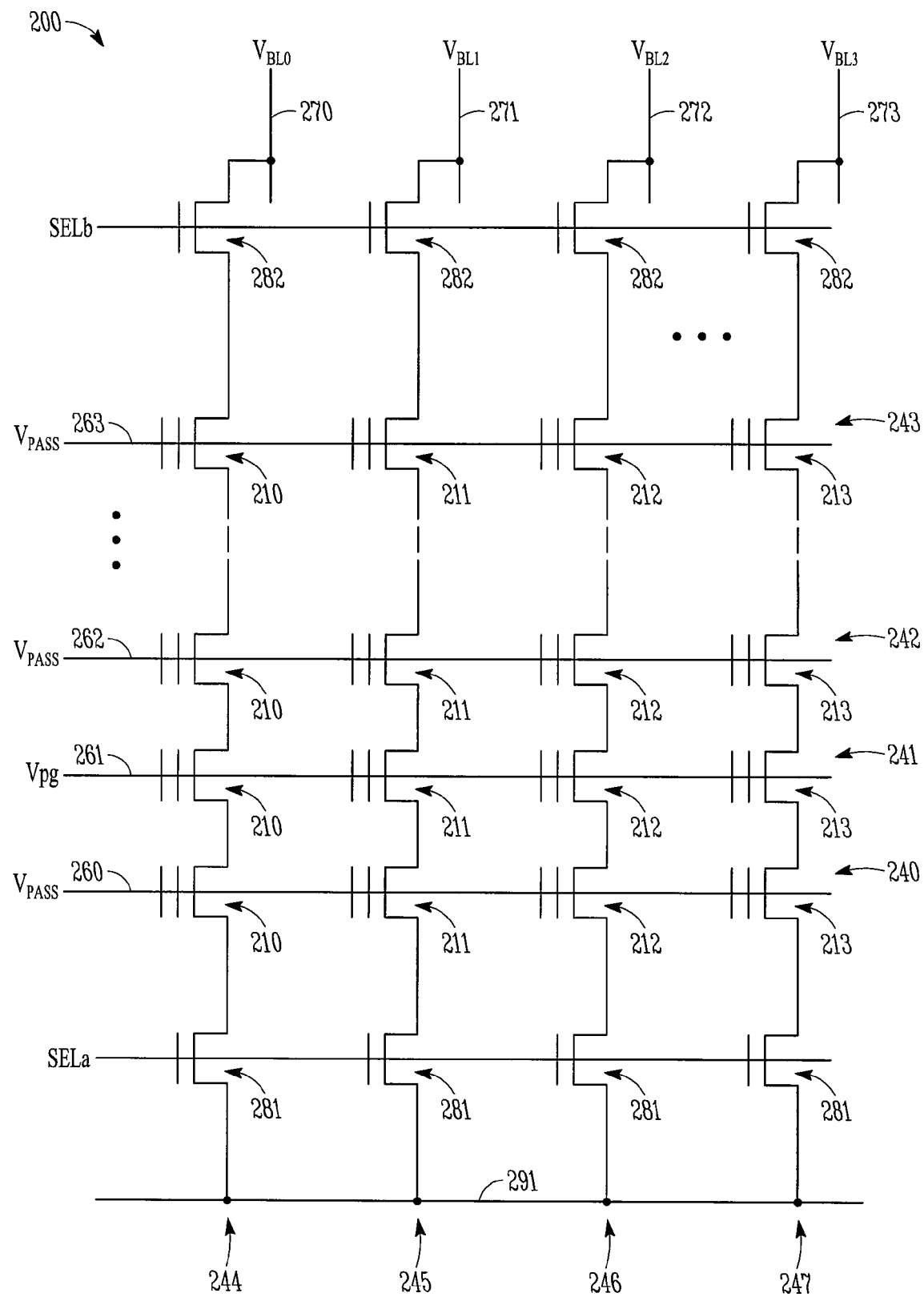
FIG. 2 shows a partial schematic diagram of a memory device, according to an embodiment of the invention.

FIG. 2 shows a partial schematic diagram of a memory device 200, according to an embodiment of the invention. Memory device 200 can be associated with memory device 100 of FIG. 1, such as forming a portion of memory array 102 of memory device 100. In FIG. 2, memory device 200 includes memory cells 210, 211, 212, and 213, arranged in rows 240, 241, 242, and 243, and columns 244, 245, 246, and 247. The memory cells in the same column may be connected in a series (sometimes called a string) of memory cells in their respective column, as illustrated in FIG. 2. FIG. 2 shows an example of four rows and four columns with four memory cells in each column. The number of rows, columns, and memory cells may vary.

As shown in FIG. 2, the memory cells in the same row (e.g., row 241) can be coupled to one of access lines 260, 261, 262, and 263. These access lines can correspond to portions of word lines of a memory device, and in at least some instances can form control gates for the memory cells. Memory device 200 uses access lines 260, 261, 262, and 263 to access memory cells 210, 211, 212, and 213 during a read operation to sense (e.g., read) data stored in memory cells 210, 211, 212, and 213, and during a programming operation to store (e.g., program or write) data into memory cells 210, 211, 212, and 213. Memory device 200 uses lines 270, 271, 272, and 273 to transfer the data read from these memory cells during a read operation. Memory device 200 also includes transistors 281 and 282 (responsive to signals SELa and SELb, respectively) to couple the memory cells in columns 244, 245, 246, and 247 to data lines 270, 271, 272, and 273, respectively. Data lines 270, 271, 272, and 273 may correspond to portions of bit lines of a memory device. Line 291 may correspond to a portion of a source (voltage) line of a memory device.

Memory device 200 stores data into memory cells 210, 211, 212, and 213 in a programming operation. The data stored in a particular memory cell (e.g., one of memory cells 210, 211, 212, and 213) is indicated by a state of the cell, such as the threshold voltage value of that particular memory cell, the charge stored by that particular cell, and/or a resistance state of that particular, for example. For a multi-level-cell memory device, each memory cell can be programmed to have a respective programmed state to represent each possible combination of multiple bits that can be stored in each memory cell. For example, when each of memory cells 210, 211, 212, and 213 corresponds to a 3-bit per cell, each of these memory cells can be programmed to have a threshold voltage within one of eight different threshold voltage ranges to represent a value corresponding to one of eight possible combinations of three binary bits of data (i.e., one of 000, 001, 010, 011, 100, 101, 110, and 111).

During a programming operation, memory device 200 may apply different voltages (e.g., voltages Vpg and Vpass) to access lines 260, 261, 262, and 263 to store data into selected memory cells among the memory cells of memory device 200. In the description herein, selected memory cells refer to the memory cells that are selected to store data in a particular programming operation, and unselected memory cells refer to the memory cells that are not selected to store data in that particular programming operation. The values (e.g., corresponding to a memory address) of the signals on terminals, such as terminals 110 and 111 of FIG. 1, can be used to determine which memory cells are selected for programming in a programming operation.

FIG. 2 shows an example where memory cells 210, 211, 212, and 213 in row 241 are selected memory cells to store data in a programming operation. The memory cells in rows 240, 242, and 243 are unselected memory cells. As shown in the example of FIG. 2, during a programming operation, memory device 200 applies voltage Vpg to access line 261 associated with the selected memory cells in row 241 and applies the same voltage Vpass to other access lines 260, 262, and 263 associated with unselected memory cells in rows 240, 242, and 243. Memory device may also apply voltages $V_{BL0}, V_{BL1}, V_{BL2},$ and $V_{BL3}$ with different values to data lines 270, 271, 272, and 273, respectively.

In the example shown in FIG. 2, memory device 200 may use a substantially constant value for voltage Vpass (e.g., approximately ten volts) to cause the unselected memory cells to operate as pass elements during a programming operation. Memory device 200 may use a value from approximately 15 volts to approximately 20 volts for voltage Vpg to program selected memory cells with threshold voltage values to represent data store therein.

Figure 3:
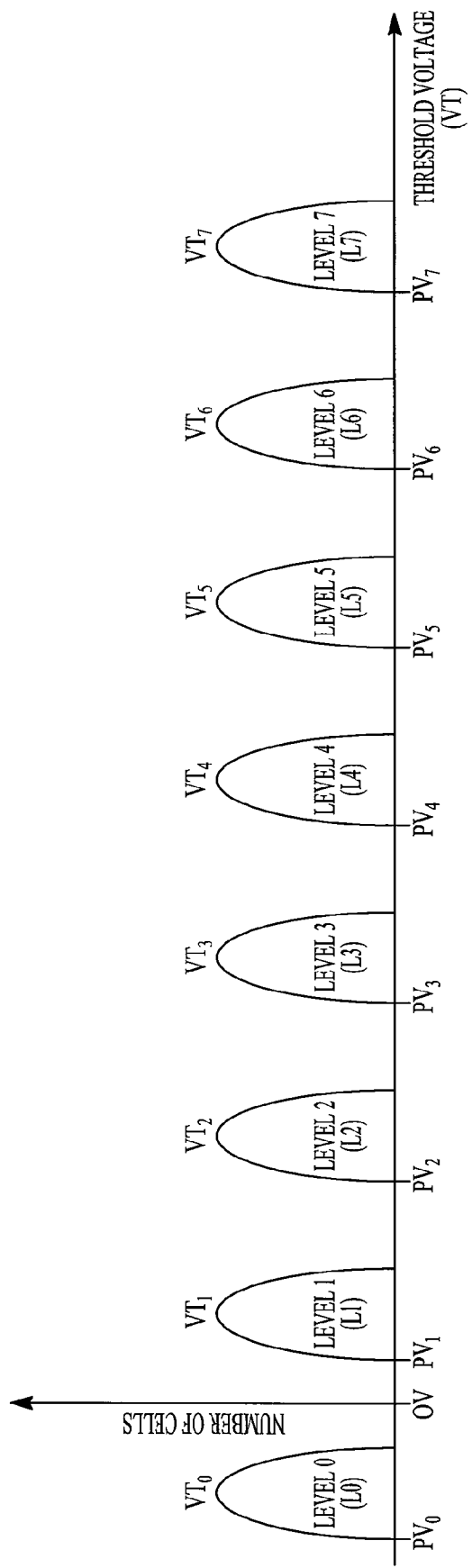
FIG. 3 shows an example of programmed states of the memory device of FIG. 2, according to an embodiment of the invention.

FIG. 3 shows an example of programmed states of memory device 200 of FIG. 2, according to an embodiment of the invention. As described above, memory device 200 can be a multi-level-cell memory device. For example, memory device 200 can be a 3-bit per cell memory device. There are eight possible combinations of 3 bits. FIG. 3 shows eight states (sometimes called levels): level 0 (L0) through level 7 (L7) corresponding to eight different combinations of 3 bits. Thus, the total number of levels "n" is eight (n=8). Each level has a corresponding unique threshold voltage value range. For example, each of levels 0 through 7 has corresponding ranges for values of threshold voltages, labeled threshold voltage $VT_0$ through $VT_7$, respectively, which can also be used to indicate the respective programmed state. As shown in FIG. 3, the value of the threshold voltages in programmed states $VT_0$ through $VT_7$ go from lowest threshold voltage (those corresponding to level 0/programmed state $VT_0$) to highest threshold voltage value (those corresponding to level 7/programmed state $VT_7$). In at least some embodiments, the threshold voltages corresponding to programmed state $VT_0$ may have negative values, and the threshold voltages corresponding to each of the programmed states $VT_1$ through $VT_7$ may have positive values.

Each programmed state in FIG. 3 has an associated verify voltage $PV_i$, where index i corresponds to the programmed state. For example, programmed state $VT_0$ has associated verify voltage $PV_0$. Programmed state $VT_1$ has associated verify voltage $PV_1$. Programmed state $VT_2$ has associated verify voltage $PV_2$, and so on. As shown in FIG. 3, a verify voltage $PV_i$ of a particular programmed is greater than the threshold voltage values corresponding to all lower programmed states. For example, $PV_7$ of programmed state $VT_7$ is greater than the values of the threshold voltages corresponding to programmed states $VT_6$ and the other lower programmed states.

Memory device 200 can use verify voltage $PV_i$ during a verify operation within the programming operation to determine whether a memory cell being programmed has reached its target programmed state during the programming operation. A verify operation can include sensing the memory cell and comparing its threshold voltage value with verify voltage $PV_i$. A memory cell has reached its target programmed state if its threshold voltage value exceeds its associated verify voltage $PV_i$. If the memory cell has not reached its target programmed state, then the programmed operation and verify operation are repeated until the threshold voltage value of the memory cell exceeds its associated verify voltage $PV_i$. Each time the programming operation repeats programming a memory cell, the value of the voltage on the access line (e.g., Vpg in FIG. 2) associated with the memory cell being programmed can be adjusted (e.g., increased). Each time the programming operation repeats programming a memory cell, the value of the voltage on the data line (e.g., $V_{BL0}, V_{BL1}, V_{BL2},$ or $V_{BL3}$ in FIG. 2) associated with the memory cell being programmed can remain the same or can be changed (increased or decreased), based on the threshold voltage value of the memory cell, as explained in more detail with reference to FIG. 4 through FIG. 6.

In FIG. 3, for example, if a particular memory cell is to be programmed to have a threshold voltage value corresponding to programmed state $VT_1$, then during a programming operation, memory device 200 can perform a verify operation to compare the threshold voltage of that particular memory cell with verify voltage $PV_1$. In this example, the particular memory cell has reached its target programmed state if the threshold voltage of that particular memory cell during the programming operation exceeds verify voltage $PV_1$. If the threshold voltage of that particular memory cell during the programming operation does not exceed verify voltage $PV_1$ during the verify operation, meaning that the particular memory cell has not reached its target programmed state, then the programming operation and verify operation are repeated until the threshold voltage value of that memory cell exceeds its associated verify voltage $PV_1$.

Figure 4:
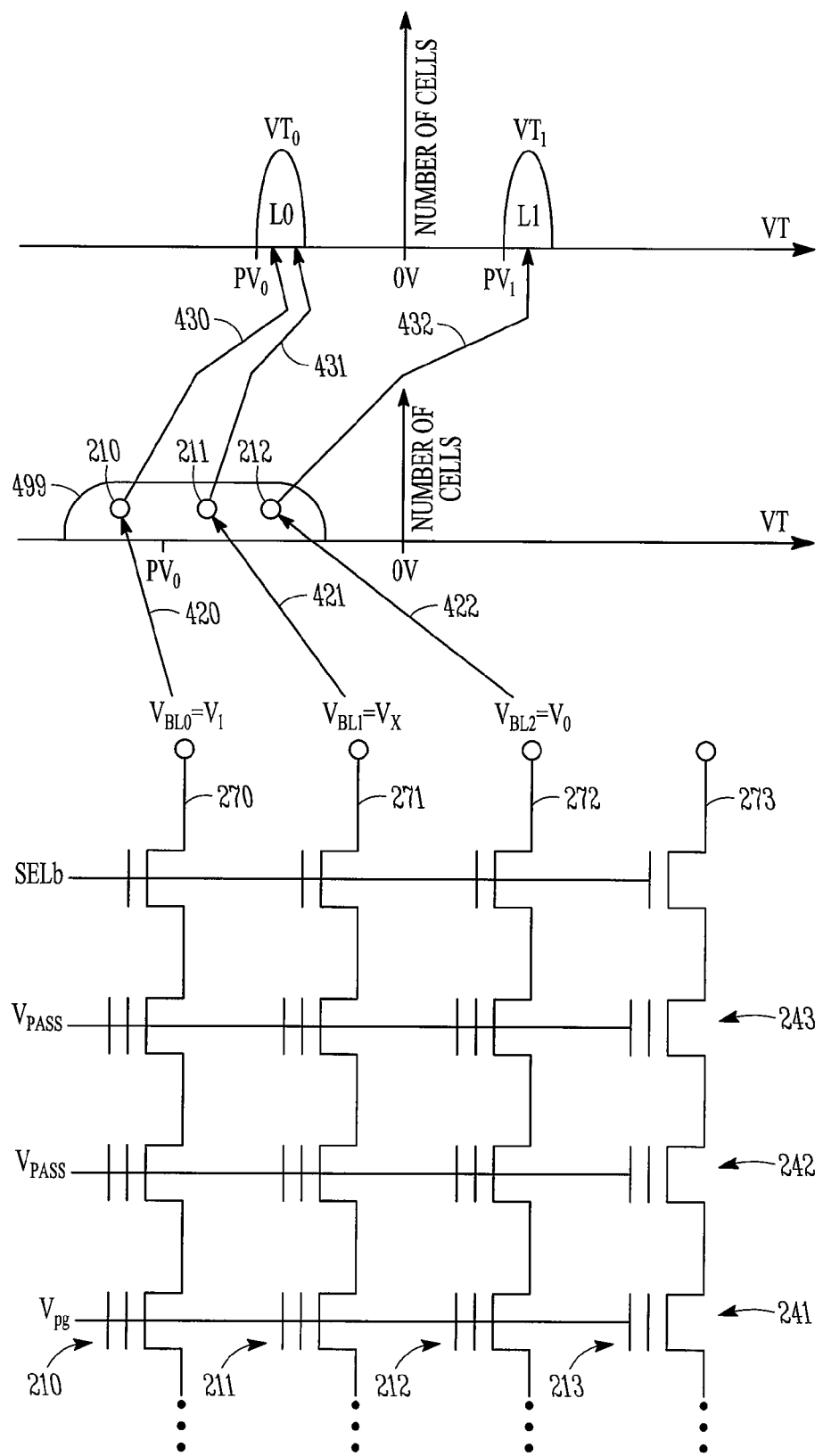
FIG. 4 shows a diagram illustrating example values of voltages applied to data lines of various memory cells of the memory device of FIG. 2 during a programming operation, according to an embodiment of the invention.

FIG. 4 shows a diagram illustrating example values of voltages applied to data lines of various memory cells of memory device 200 of FIG. 2 during a programming operation, according to an embodiment of the invention. Numerous memory cells in FIG. 2 can be in erased state 499 in FIG. 4. However, to help focus on the description herein, only three memory cells 210, 211, and 212 of FIG. 4 are in erased state 499, as indicated by arrows 420, 421, and 422.

FIG. 4 shows a verify voltage $PV_0$, which has a negative value, as indicated in FIG. 4 as being less than zero volts. In an erased state, such as erased state 499 in FIG. 4, memory cells 210, 211, 212, and 213 can have a negative threshold voltage value. For example, memory cell 210 has a negative threshold voltage value less than verify voltage $PV_0$ (more negative than $PV_0$); each of memory cells 211 and 212 has a negative threshold voltage value greater than verify voltage $PV_0$ (less negative than $PV_0$) and less than zero. The memory cells of memory device 200, such as memory cells 210, 211, 212, and 213 (FIG. 2) can be in erased state 499 after an erase operation of memory device 200 is performed to memory cells 210, 211, 212, and 213.

During a programming operation, different voltages can be applied to data lines 270, 271, and 272 based on the threshold voltage values of memory cells 210, 211, and 212 in erased state 499 and based on the programmed states to which memory cells 210, 211, and 212 are to be programmed. For example, as shown in FIG. 4, memory cells 210 and 211 are to be programmed to programmed state $VT_0$ (level 0), as indicated by corresponding arrows 430 and 431, and memory cell 212 is to be programmed to programmed state $VT_1$ (level 1), as indicated by arrow 432. Programmed states $VT_0$ and $VT_1$ can correspond to $VT_0$ and $VT_1$ of FIG. 3. As shown in FIG. 4, different voltages $V_0$, $V_1$, and $V_X$ can be applied to data lines 270, 271, and 272 based on the threshold voltage values of memory cells 210, 211, and 212 in erased state 499.

If a threshold voltage value of a particular memory cell in erased state 499 is greater than (exceeds) a value of verify voltage $PV_0$ and the particular memory cell is to be programmed to programmed state $VT_0$, then a voltage $V_X$ can be applied to a data line associated with that particular memory cell. Voltage $V_X$ is a positive voltage and can be a supply voltage (e.g., Vcc) of memory device 200 (FIG. 2). Voltage $V_X$ can also be applied to a data line associated with any particular memory cell after that particular memory cell reaches its target programmed state during the programming operation. As shown in FIG. 4, the threshold voltage value of a memory cell 211 is greater than a value of verify voltage $PV_0$, and memory cell 211 is to be programmed to programmed state $VT_0$ (indicated by arrow 431). Thus, voltage $V_X$ can be applied to data line 271 associated with memory cell 211 when it is programmed from erased state 499 to programmed state $VT_0$.

If a threshold voltage value of a particular memory cell in erased state 499 is less than a value of verify voltage $PV_0$ and the particular memory cell is to be programmed to programmed state $VT_0$, then a voltage $V_1$ can be applied to a data line associated with that particular memory cell. Voltage $V_1$ can be a positive voltage and can be less than voltage $V_X$. For example, during a programming operation, Vpg (FIG. 2) can be approximately 15 volts, $V_1$ can be approximately one volt, and $V_X$ can be approximately two volts. As shown in FIG. 4, the threshold voltage value of a memory cell 210 is less than a value of verify voltage $PV_0$, and memory cell 210 is to be programmed to programmed state $VT_0$ (indicated by arrow 430). Thus, voltage $V_1$ can be applied to data line 270 associated with memory cell 210 when it is programmed from erased state 499 to programmed state $VT_0$.

If a particular memory cell is to be programmed to programmed state $VT_1$, then a voltage $V_0$ can be applied to a data line associated with that particular memory cell, regardless of a threshold voltage value of that particular memory cell in erased state 499. For example, as shown in FIG. 4, memory cell 212 is to be programmed to programmed state $VT_1$ (indicated by arrow 432). Thus, voltage $V_0$ can be applied to data line 272 associated with memory cell 212 when it is programmed from erased state 499 to programmed state $VT_1$. Among voltages $V_X$, $V_1$ (described above) and $V_0$, voltage $V_X$ can have a highest value, voltage $V_0$ can have a lowest value, and voltage $V_1$ can have a value between the values of $V_X$ and $V_0$. For example, voltages $V_X$, $V_1$, and $V_0$ can be two volts, one volt, and zero volts, respectively. FIG. 4 shows an example where the threshold voltage value of memory cell 212 is greater than verify voltage $PV_0$ and voltage $V_0$ can be applied to data line 272. However, the same voltage $V_0$ could still be applied to data line 272 if the threshold voltage value of memory cell 212 is less than verify voltage $PV_0$ because memory cell 212 is to be programmed to programmed state $VT_1$.

Erased state 499 may encompass a wide range of threshold voltage values. Programming the memory cells with different voltages at different data lines, as described above, may tighten the threshold voltage value ranges of the memory cells to improve operations of the memory device.

Figures 5, 6:
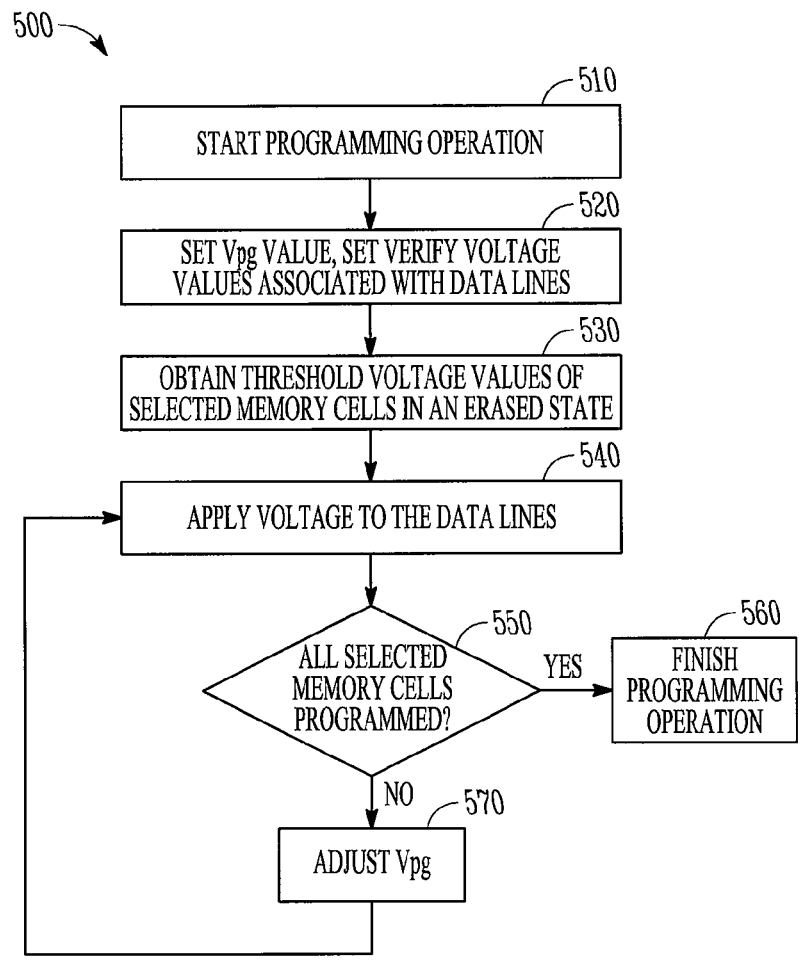
FIG. 5 shows a flow diagram of a method for programming a memory device, according to an embodiment of the invention.
FIG. 6 shows a chart illustrating an example of various voltages applied to data lines associated with memory cells in a programming operation of the memory cells from an erased state to various programmed states, according to an embodiment of the invention.

FIG. 5 shows a flow diagram of a method 500 for programming a memory device, according to an embodiment of the invention. The memory device used in method 500 can include memory device 100 of FIG. 1 and memory device 200 of FIG. 2.

Activity 510 of method 500 includes starting to perform a programming operation when the memory device receives a write command. The write command may be received from an external device such as a processor or a memory controller.

Activity 520 of methods 500 includes setting a value of voltage Vpg, which is applied to an access line associated with memory cells that are selected for programming (selected memory cells). For example, activity 520 may set the value of voltage Vpg at approximately 15 volts. Other voltage values can be used. Activity 520 may also include setting values of verify voltages for particular data lines based on data (e.g., provided by a user) to be programmed into the selected memory cells associated with those particular data lines. The values of the verify voltages used in method 500 can be similar to verify voltages $PV_i$ associated with each of programmed states $VT_0$ (L0) through $VT_7$ (L7) of FIG. 3, where i corresponds to the state number. For example, in activity 520, if a memory cell associated with a particular data line is to be programmed to have a threshold voltage value corresponding to programmed state $VT_0$ (L0), then activity 520 may set an appropriate value of the verify voltage (e.g., $PV_0$) associated with that particular data line. During programming, the threshold voltage value of the selected memory cell is compared with the value of its associated verify voltage (set by activity 520) to determine whether the memory cell being programmed has reached its target programmed state. Since different memory cells associated with the same access line may be programmed to have different programmed states (e.g., $VT_0$ and $VT_1$), activity 520 may set different values of verify voltages (e.g., $PV_0$ and $PV_1$) for different data lines.

Activity 530 of methods 500 includes obtaining threshold voltage values of the memory cells that are to be programmed. For example, activity 530 may include sensing these memory cells to obtain their threshold voltage values. Activity 530 may include performing a read operation to sense these memory cells. As described above, the threshold voltage values obtained in activity 530 are threshold voltage values of selected memory cells in an erased state, such as erased state 499 of FIG. 4.

Activity 540 includes applying voltages to data lines associated with the selected memory cells based on the threshold voltage values of the selected memory cells obtained in activity 530 and based on the programmed states to which the selected memory cells are to be programmed. Activity 540 may apply different voltages in ways similar to voltages $V_0$, $V_1$, and $V_X$ being applied to data lines 272, 270, and 271 (FIG. 4), respectively, as described above with reference to FIG. 4.

Activity 560 includes applying voltage Vpg to the selected access line, which is the access line associated with the memory cells being programmed. Voltage Vpg may include a number of programming pulses with different magnitude values.

Activity 550 includes determining whether the selected memory cells have been programmed to their respective target programmed states. For example, activity 550 may determine whether the selected memory cells exceed their respective verify voltage values. If all of the selected memory cells have reached their respective target programmed state, then method 500 continues with activity 560 to finish the programming operation. If all of selected memory cells have not reached their respective target programmed state, then method 500 continues with activity 570.

Activity 570 includes adjusting (e.g., increasing) the value of voltage Vpg. Then, method 500 repeats one or more of activity 540, activity 550, and activity 570 until all of the selected memory cells reach their target programmed states. When activity 540 is repeated (e.g., in the next pulse of voltage Vpg), the voltages applied to the data lines can remain unchanged for selected memory cells that have not reached their target programmed state. For selected memory cells that have reached their target programmed states, an inhibit voltage can be applied to data lines associated with those selected memory cells in order to prevent further programming of those memory cells. The inhibit voltage can be voltage $V_X$ or other voltage, such as a supply voltage Vcc of the memory cells device where the selected memory cells reside. For example, using the same example described above with reference to FIG. 4, after a pulse (e.g., 15 volts in magnitude) of voltage Vpg is applied to access line 241 (FIG. 4), if memory cell 210 reaches its target programmed state ($VT_0$) and memory cell 212 does not reach its target programmed state ($VT_1$), then voltage $V_X$ can be applied to data lines 270 and 271 and voltage $V_1$ (unchanged) can be applied to data line 272 when activity 540 is repeated in a next pulse (e.g., 15.5 volts in magnitude) of voltage Vpg, to continue programming memory cell 212.

The method described above describes programming of memory cells from an erased state to two lower programmed states (e.g., $VT_0$ and $VT_1$) in a multi-level-cell memory device. Programming of memory cells from an erased state to higher programmed states (e.g., $VT_2$, $VT_3$ and other, as shown in FIG. 3) can be performed according to the description below with reference to FIG. 6.

FIG. 6 shows a chart 600 illustrating an example of various voltages applied to data lines associated with memory cells in a programming operation of the memory cells from an erased state to various target programmed states, according to an embodiment of the invention. In chart 600, memory cells 210, 211, 212, and 213, and voltages $V_{BL0}$, $V_{BL1}$, $V_{BL2}$, and $V_{BL3}$ correspond to those shown in FIG. 2. Chart 600 shows an example where memory cells 210, 211, 213, and 212, are to be programmed to have programmed states $VT_0$, $VT_1$, $VT_2$, and $VT_3$, respectively. Method 500 of FIG. 5 can be used to program these memory cells. However, activity 530 in method 500 can be omitted when the memory cells are programmed from the erased state to target programmed states corresponding to higher threshold voltages (e.g., $VT_2$ and higher).

In FIG. 6, $V_X$, $V_3$, $V_2$, $V_0$, and in this order, have values from highest to lowest, with example values (in volt unit) of 2.4, 1.6, 0.8, and 0. The voltage value in chart 600 can be calculated from the following formula.

$$V_{BLi} = V_X - i*(V_x/(n-1))$$

Voltage $V_X$ is known and can be the supply voltage (Vcc) of the memory device. In the formula above, "i" corresponds to the number of a target programmed state (level number) of the memory cell selected for programming. For example, if a memory cell is to be programmed to have a programmed state $VT_2$ (level L2), then i=2. In the formula above, "n" is the total number of programmed states (levels) greater than one (n>1) to which the memory cells of the multi-bit-cell memory device can be programmed. For example, for a 2-bit per cell memory device, n=4; for a 3-bit per cell memory device, n=8.

Based on the above formula, various values of voltages applied to data lines associated with multi-bit-cell memory can be calculated. For example, for 3-bit per cell memory device, using $V_X$=2.4 volts, voltage values (in volt unit) of 2.4, 2.06, 1.72, 1.38, 1.04, 0.7, 0.35, and 0 can be applied to data lines associated with memory cells programmed to programmed states $VT_0$, $VT_1$, $VT_2$, $VT_3$, $VT_4$, $VT_5$, $VT_6$, and $VT_7$, respectively.

As shown in chart 600, during a programming operation, voltages from lowest value (e.g., zero volt) to highest value (e.g., $V_X$) can be applied to data lines corresponding to memory cells that are programmed to have programmed states from highest value to lowest value. For example, as shown in chart 600, since memory cells 210, 211, 213, and 212, are to be programmed to have threshold voltages corresponding to $VT_0$, $VT_1$, $VT_2$, and $VT_3$, respectively, voltages $V_{BL0}=V_X$; $V_{BL1}=V_3$; $V_{BL3}=V_2$; and $V_{BL2}=V_0$ can be applied to data lines associated with memory cells 210, 211, 212, and 213, respectively. As shown in chart 600, $V_X$ has the highest value (e.g., 2.4 volts), $V_0$ has the lowest value (e.g., 0 volts), and $V_2$ and $V_{BL3}$ have values between $V_0$ and $V_X$.

FIG. 6 shows example voltages for 2-bit per cell memory device. Other multi-level-cell (e.g., 3-bit per cell or higher) memory devices can include programming operations described above with reference to FIG. 2 through FIG. 6.

Figure 7:
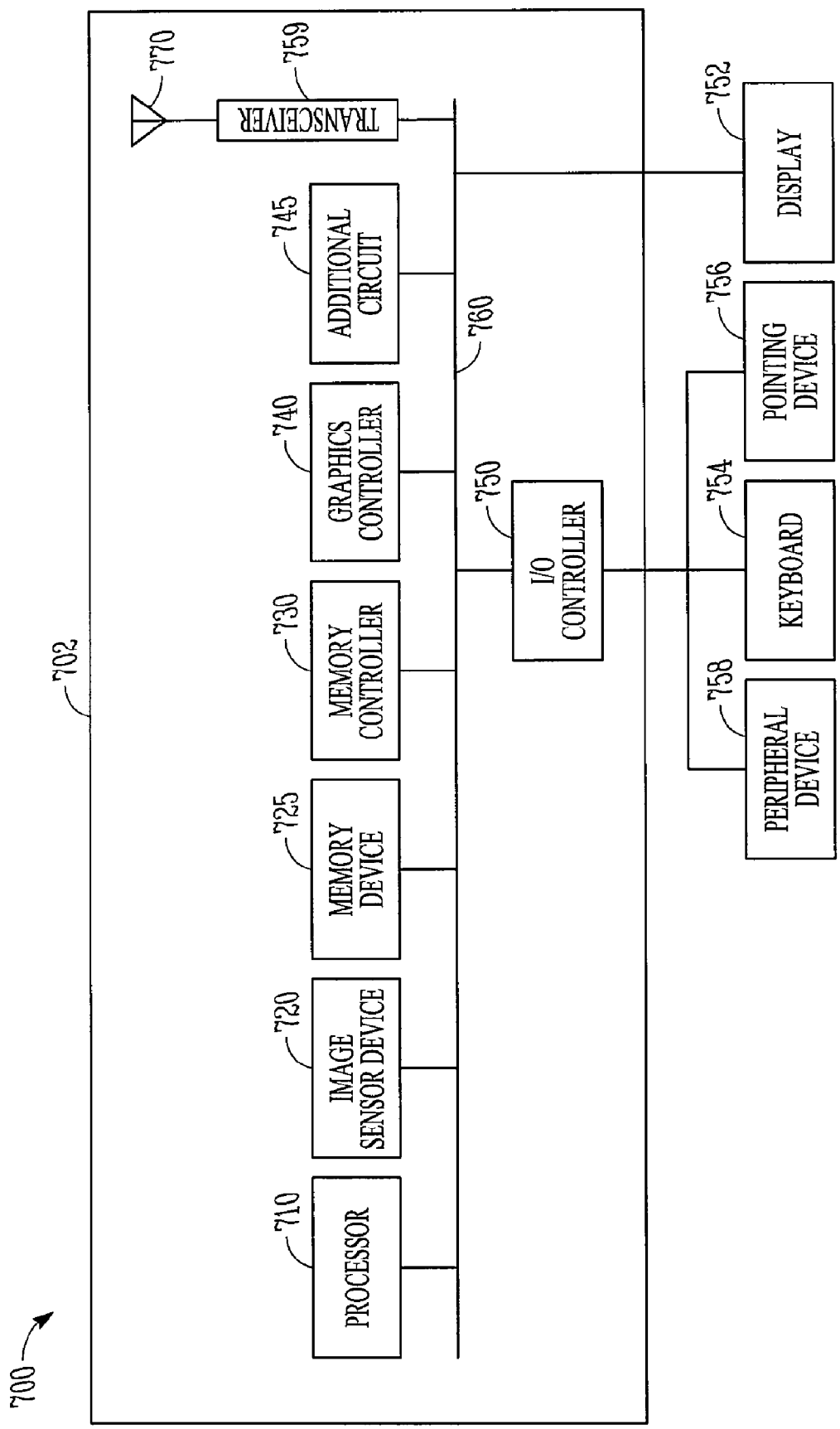
FIG. 7 shows a system according to an embodiment of the invention.

FIG. 7 shows a system 700 according to an embodiment of the invention. System 700 may include a processor 710, an image sensor device 720, a memory device 725, a memory controller 730, a graphics controller 740, an additional circuit 745, an input and output (I/O) controller 750, a display 752, a keyboard 754, a pointing device 756, a peripheral device 758, a transceiver 759, a bus 760 to transfer data among the components of system 700, a circuit board 702 where some of the components of system may be attached, and an antenna 770 to wirelessly data and receive data to and from system 700. Transceiver 759 may operate to transfer data from one or more of the components of system 700 (e.g., at least one of processor 710 and memory device 725) to antenna 770. Transceiver 759 may also operate to transfer data received at antenna 770 to at least one of the processor 710 and the memory device 725. The data received at antenna 770 may be transmitted to system 700 by a source external to system 700.

Processor 710 may include a general-purpose processor or an application specific integrated circuit (ASIC). Processor 710 may include a single core processor or a multiple-core processor. Processor 710 may execute one or more programming commands to process data. The data may include digital output data provided by other components of system 700, such as by image sensor device 720 or memory device 725.

Image sensor device 720 may include a complementary metal-oxide-semiconductor (CMOS) image sensor having a CMOS pixel array or charge-coupled device (CCD) image sensor having a CCD pixel array.

Memory device 725 may include a volatile memory device, a non-volatile memory device, or a combination of both. For example, memory device 725 may comprise a dynamic random access memory (DRAM) device, a static random access memory (SRAM) device, a flash memory device, or a combination of these memory devices. Memory device 725 may include one or more of the various embodiments described herein, such as memory devices 100 (FIG. 1) and 200 (FIG. 2).

Display 752 may include an analog display or a digital display. Display 752 may receive data from other components. For example, display 752 may receive data that is processed by one or more of image sensor device 720, memory device 725, graphics controller 740, and processor 710 to display data such as text or images.

Additional circuit 745 may include circuit components used in a vehicle. Additional circuit 745 may receive data from other components to activate one or more subsystem of the vehicle. For example, additional circuit 745 may receive data that is processed by one or more of image sensor device 720, memory device 725, and processor 710, to activate one or more of an air bag system of a vehicle, a vehicle security alarm, and an obstacle alert system.

The illustrations of apparatus (e.g., memory devices 100 and 200) and systems (e.g., system 700) are intended to provide a general understanding of the structure of various embodiments and are not intended to provide a complete description of all the elements and features of apparatus and systems that might make use of the structures described herein.

Any of the components described above can be implemented in a number of ways, including simulation via software. Thus, apparatus (e.g., a portion of memory device 100 or the entire memory device 100, and portion of memory device 200 or the entire memory device 200) and systems (e.g., a portion of system 700 or the entire system 700) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., memory devices 100 and 200) and systems (e.g., system 700), and as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The apparatus and systems of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others The embodiments described above with reference to FIG. 1 through FIG. 7 include memory devices and methods of programming memory cells of the memory device. One such method includes applying voltages to data lines associated with different groups of memory cells during a programming operation. The method applies the voltages to the data lines associated with a last group of memory cells being programmed in a different fashion from the other groups of memory cells after the other groups of memory cells have been programmed.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon studying and understanding the above description.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. A method comprising:
applying a voltage to a data line associated with a memory cell to be programmed, the voltage having a first value if the memory cell is being programmed from an erased state to a programmed state and if a threshold voltage value of the memory cell in the erased state is less than a verify voltage value, the voltage having a second value if the memory cell is being programmed from the erased state to the programmed state and if the threshold voltage value of the memory cell in the erased state is greater than the verify voltage value.

2. The method of claim 1, wherein the programmed state comprises a first programmed state and the voltage has a third value if the memory cell is being programmed from the erased state to a second programmed state.

3. The method of claim 2, wherein the third value is less than each of the first value and the second value.

4. The method of claim 3, wherein the third value is zero.

5. The method of claim 2, wherein the second programmed state comprises a state where the memory cell has a positive threshold voltage value.

6. The method of claim 1, wherein the programmed state comprises a state where the memory cell has a negative threshold voltage value.

7. The method of claim 1, wherein the first value is less than the second value.

8. The method of claim 1, further comprising:
sensing the memory cell to obtain the threshold voltage value of the memory cell in the erased state before the memory cell is programmed from the erased state to the programmed state.

9. A method comprising:
applying a first voltage to a first data line associated with a first memory cell if the first memory cell is being programmed from an erased state to a first programmed state and if a threshold voltage value of the first memory cell in the erased state is less than a verify voltage value;
applying a second voltage to a second data line associated with a second memory cell if the second memory cell is being programmed from the erased state to the first programmed state and if the threshold voltage value of the second memory cell in the erased state is greater than the verify voltage; and
applying a third voltage to a third data line associated with a third memory cell if the third memory cell is being programmed from the erased state to a second programmed state.

10. The method of claim 9, wherein the first programmed state comprises a state where the memory cell has a negative threshold voltage value and the second programmed state comprises a state where the memory cell has a positive threshold voltage value.

11. The method of claim 9, wherein a value of the first voltage is between a value of the second voltage and a value of the third voltage.

12. The method of claim 9, wherein the third voltage has a value of zero.

13. The method of claim 9, wherein a value of the second voltage is equal to a value of a supply voltage of a memory device in which the memory cell is included.

14. A method comprising:
applying a first voltage to a first data line associated with a first memory cell if the first memory cell is being programmed from an erased state to a first programmed state;
applying a second voltage to a second data line associated with a second memory cell if the second memory cell is being programmed from the erased state to a second programmed state; and
applying a third voltage to a third data line associated with a third memory cell if the third memory cell is being programmed from the erased state to a third programmed state, wherein the first voltage has a highest value relative to values of the second and third voltages, the first programmed state comprises a state where the first memory cell has a threshold voltage value within a first range of voltages, the second programmed state comprises a state where the second memory cell has a threshold voltage value within a second range of voltages, and the third programmed state comprises a state where the third memory cell has a threshold voltage value within a third range of voltages, and wherein the first range includes threshold voltage values that are less than those in each of the second and third ranges.

15. The method of claim 14, wherein the threshold voltage value of the first memory cell includes a negative threshold voltage value and the threshold voltage values of the second and third programmed states include a positive threshold voltage value.

16. A method comprising:
applying a first voltage to a first data line associated with a first memory cell if the first memory cell is being programmed from an erased state to a first programmed state;
applying a second voltage to a second data line associated with a second memory cell if the second memory cell is being programmed from the erased state to a second programmed state; and
applying a third voltage to a third data line associated with a third memory cell if the third memory cell is being programmed from the erased state to a third programmed state, wherein the each of the first and second voltages has a positive value, and the third voltage is zero.

17. An apparatus comprising:
memory cells; and
a module configured to apply a voltage to a data line associated with a memory cell included in the memory cells during programming of the memory cell, the voltage having a first value if the memory cell is being programmed from an erased state to a programmed state and if a threshold voltage value of the memory cell in the erased state is less than a verify voltage value, the voltage having a second value if the memory cell is being programmed from the erased state to the programmed state and if the threshold voltage value of the memory cell in the erased state is greater than the verify voltage value.

18. The apparatus of claim 17, wherein the module is configured to compare the threshold voltage value of the memory cell in the erased state with the verify voltage value before applying the voltage to the data line.

19. The apparatus of claim 17, wherein the module is configured to apply an additional voltage to another data line associated with an additional memory cell included in the memory cells, without comparing a threshold voltage value of the additional memory cell in the erased state with the verify voltage if the additional memory cell is being programmed from the erased state to a second programmed state.

20. The apparatus of claim 17, wherein the first programmed state comprises a state where the memory cell has a negative threshold voltage value and the second programmed state comprises a state where the memory cell has a positive threshold voltage value.

21. An apparatus comprising:
a first memory cell, a second memory cell, and a third memory cell; and
a module configured to:
apply a first voltage to a first data line associated with the first memory cell if the first memory cell is being programmed from an erased state to a first programmed state;
apply a second voltage to a second data line associated with the second memory cell if the second memory cell is being programmed from the erased state to a second programmed state; and apply a third voltage to a third data line associated with the third memory cell if the third memory cell is being programmed from the erased state to a third programmed state wherein the first programmed state comprises a state where the first memory cell has a negative threshold voltage value and the second and third programmed states comprise states where a respective memory cell has a positive threshold voltage value, wherein a value of the first voltage is highest relative to a value of the second voltage and a value of the third, the value of the second voltage is positive, and the value of the third voltage is zero.

22. The apparatus of claim 21, wherein a threshold voltage value of a memory cell in the first programmed state is less than the threshold voltage value of a memory cell in either the second or third programmed state.

23. The apparatus of claim 22, wherein a threshold voltage value of a memory cell in the third programmed state is greater the threshold voltage value of a memory cell in either the first or second programmed state.

* * * * *

UNITED STATES PATENT AND TRADEMARK OFFICE
CERTIFICATE OF CORRECTION

PATENT NO. : 8,400,827 B2
APPLICATION NO. : 12/795202
DATED : March 19, 2013
INVENTOR(S) : Violante Moschiano et al.

It is certified that error appears in the above-identified patent and that said Letters Patent is hereby corrected as shown below:

In the Claims

In column 13, line 4, in Claim 21, delete "state" and insert -- state, --, therefor.

Signed and Sealed this
Fourth Day of June, 2013

Teresa Stanek Rea
*Acting Director of the United States Patent and Trademark Office*